(12) United States Patent
Lee et al.

(10) Patent No.: US 10,269,496 B2
(45) Date of Patent: Apr. 23, 2019

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Won Young Lee, Suwon-si (KR); Sung Kwon An, Suwon-si (KR); Taek Jung Lee, Suwon-si (KR); Jin Kyung Joo, Suwon-si (KR); Hyo Youn Lee, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/484,311

(22) Filed: Apr. 11, 2017

(65) Prior Publication Data
US 2018/0090275 A1 Mar. 29, 2018

(30) Foreign Application Priority Data
Sep. 26, 2016 (KR) .................. 10-2016-0123001

(51) Int. Cl.
*H01G 4/005* (2006.01)
*H01G 4/12* (2006.01)
(Continued)

(52) U.S. Cl.
CPC .............. *H01G 4/30* (2013.01); *H01G 4/005* (2013.01); *H01G 4/1227* (2013.01);
(Continued)

(58) Field of Classification Search
CPC .......... H01C 1/148; H01G 4/005; H01G 4/12; H01G 4/1227; H01G 4/224; H01G 4/228; H01G 4/30; H01G 4/232; H01G 4/248; H01G 4/2325; H05K 1/18; H05K 1/181; H05K 2201/10015
(Continued)

(56) References Cited

U.S. PATENT DOCUMENTS

2002/0158307 A1 10/2002 Honda et al.
2006/0198079 A1 9/2006 Shim et al.
(Continued)

FOREIGN PATENT DOCUMENTS

JP 2014187216 A * 10/2014 ............... H01G 4/12
JP 2014187216 A * 10/2014 ............... H01G 4/12
(Continued)

*Primary Examiner* — Timothy J Thompson
*Assistant Examiner* — Guillermo J Egoavil
(74) *Attorney, Agent, or Firm* — Morgan Lewis & Bockius LLP

(57) ABSTRACT

A multilayer capacitor includes a body including dielectric layers, and first and second internal electrodes alternately disposed with respective dielectric layers interposed therebetween, first and second groove parts formed in external surfaces of the body in a first direction in which the dielectric layers are stacked, having at least one corner, and contacting the first and second internal electrodes, respectively, and first and second connection electrodes disposed in the first and second groove parts, respectively, and electrically connected to the first and second internal electrodes, respectively.

13 Claims, 7 Drawing Sheets

(51) Int. Cl.
    *H01G 4/228*     (2006.01)
    *H05K 1/18*     (2006.01)
    *H01G 4/30*     (2006.01)

(52) U.S. Cl.
    CPC ............ *H01G 4/228* (2013.01); *H05K 1/181* (2013.01); *H05K 2201/10015* (2013.01)

(58) Field of Classification Search
    USPC ........................................ 174/260; 361/301.3
    See application file for complete search history.

(56) References Cited

U.S. PATENT DOCUMENTS

| | | | | |
|---|---|---|---|---|
| 2014/0138138 | A1* | 5/2014 | Park | H05K 1/183 |
| | | | | 174/260 |
| 2015/0060122 | A1* | 3/2015 | Lee | H05K 1/185 |
| | | | | 174/260 |
| 2015/0255215 | A1* | 9/2015 | Shirakawa | H01C 1/148 |
| | | | | 361/301.3 |
| 2015/0380167 | A1 | 12/2015 | Lim et al. | |
| 2018/0332715 | A1* | 11/2018 | Woo | H05K 3/341 |

FOREIGN PATENT DOCUMENTS

| | | | |
|---|---|---|---|
| JP | 2016012640 A | * | 1/2016 |
| KR | 10-0483944 B1 | | 4/2005 |
| KR | 10-2006-0098771 A | | 9/2006 |
| KR | 10-2016-0000753 A | | 1/2016 |

\* cited by examiner

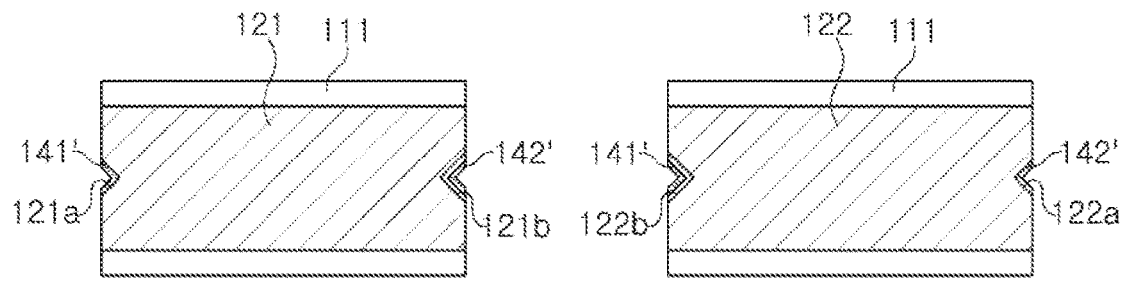
FIG. 5A  FIG. 5B
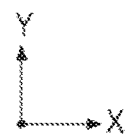
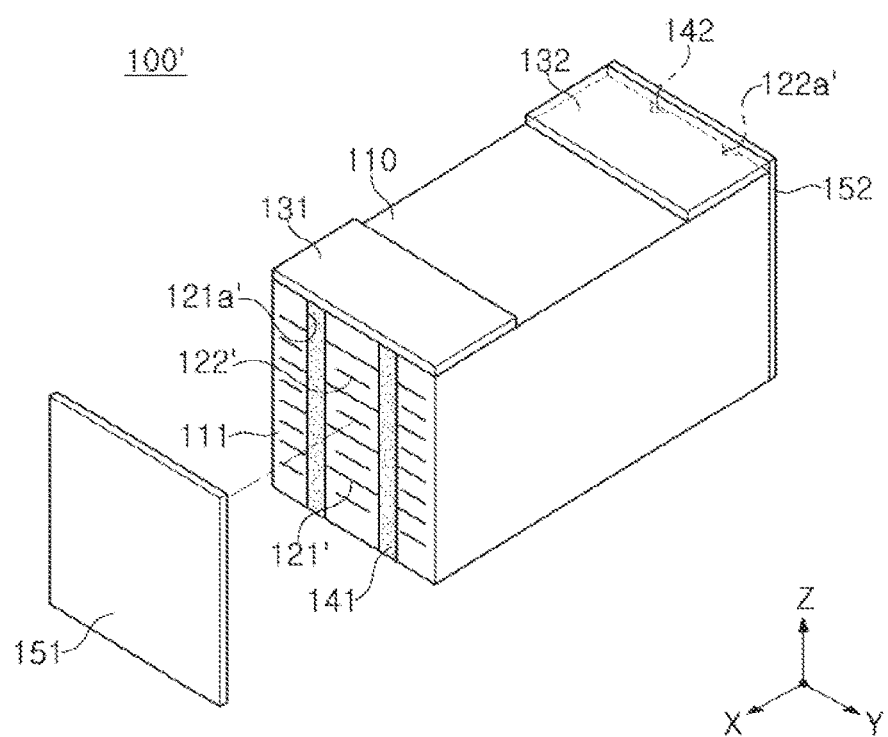
FIG. 6

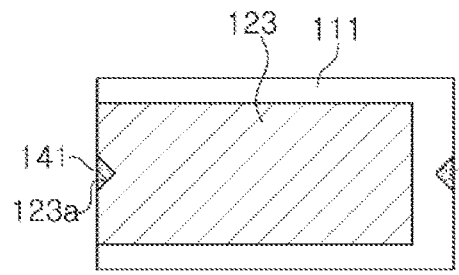
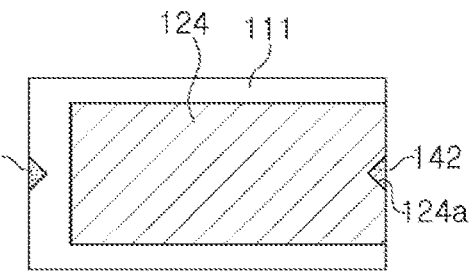
FIG. 7A  FIG. 7B
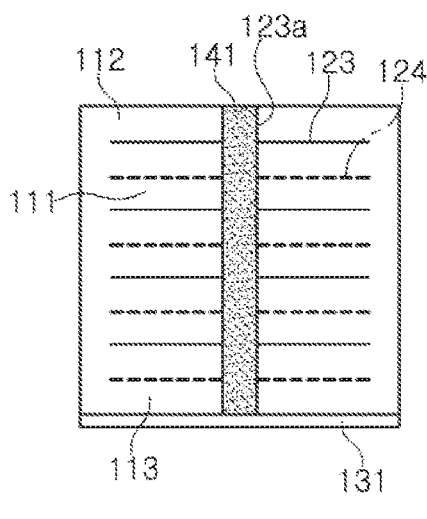
FIG. 8

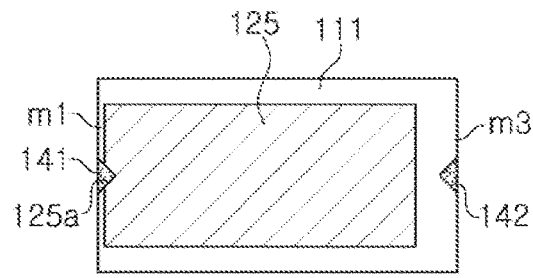
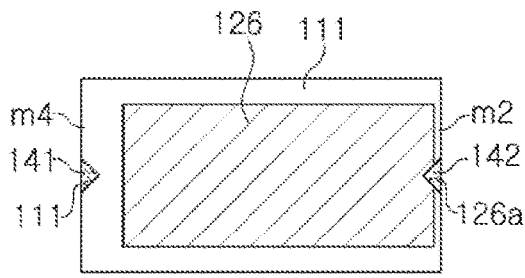
FIG. 9A  FIG. 9B
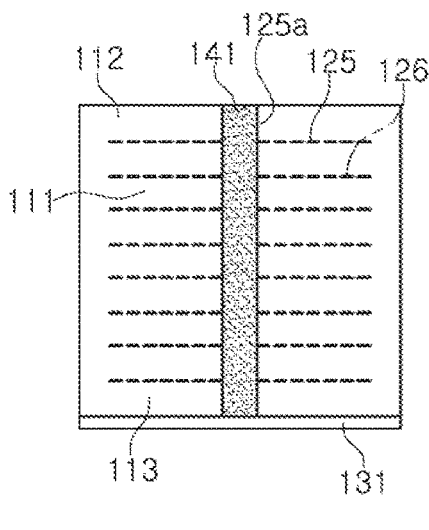
FIG. 10

MULTILAYER CAPACITOR AND BOARD HAVING THE SAME

CROSS-REFERENCE TO RELATED APPLICATION(S)

This application claims the benefit of priority to Korean Patent Application No. 10-2016-0123001 filed on Sep. 26, 2016 in the Korean Intellectual Property Office, the entire disclosure of which is incorporated herein by reference.

BACKGROUND

1. Technical Field

The present disclosure relates to a multilayer capacitor and a board having the same.

2. Description of Related Art

A multilayer capacitor is commonly mounted on the circuit boards of various types of electronic products, such as image display devices, for example, a liquid crystal display (LCD), a plasma display panel (PDP), and the like, as well as computers, personal digital assistants (PDA), cellular phones, or the like, serving to charge electricity thereto or discharge electricity therefrom.

The multilayer capacitor as described above may be used as a component in various types of electronic devices due to advantages such as a small size, high capacitance, and ease of mounting. Recently, a multilayer capacitor having high capacitance and high reliability has been developed.

In order to implement a high-capacitance multilayer capacitor, there is provided a method of increasing permittivity of a material configuring a body or thinning dielectric layers and internal electrodes to increase the number of stacked dielectric layers and internal electrodes.

However, since it is not easy to develop a composition of a high-permittivity material, and there are limitations to decreasing the thickness of the dielectric layer in a current process, there is a limitation in increasing capacitance of a product using the above-mentioned method.

Therefore, in order to increase capacitance of the product while satisfying requirements of the trend for the miniaturization of capacitors, research into a method of increasing an area of overlap between internal electrodes having different polarities is required.

Further, as a mounting density of a circuit board is increased, attempts to decrease amounting area and amounting height of the multilayer capacitor have been undertaken.

SUMMARY

An aspect of the present disclosure may provide a multilayer capacitor capable of increasing capacitance of a product while miniaturizing the product by increasing an area of overlap of internal electrodes having different polarities.

An aspect of the present disclosure may also provide a multilayer capacitor having a decreased mounting area.

According to an aspect of the present disclosure, a multilayer capacitor includes: a body including dielectric layers, and first and second internal electrodes alternately disposed with respective dielectric layers interposed therebetween; first and second groove parts formed in external surfaces of the body in a first direction in which the dielectric layers are stacked, having at least one corner, and contacting the first and second internal electrodes, respectively; and first and second connection electrodes disposed in the first and second groove parts, respectively, and electrically connected to the first and second internal electrodes, respectively.

According to another aspect of the present disclosure, a board having a multilayer capacitor includes: a circuit board having one surface on which first and second electrode pads are disposed; and the multilayer capacitor as described above, mounted on the circuit board, wherein the multilayer capacitor includes: a body including dielectric layers, and first and second internal electrodes alternately disposed with respective dielectric layers interposed therebetween; first and second groove parts formed in external surfaces of the body in a first direction in which the dielectric layers are stacked, having at least one corner, and contacting the first and second internal electrodes, respectively; and first and second connection electrodes disposed in the first and second groove parts, respectively, and electrically connected to the first and second internal electrodes, respectively.

BRIEF DESCRIPTION OF DRAWINGS

The above and other aspects, features, and advantages of the present disclosure will be more clearly understood from the following detailed description taken in conjunction with the accompanying drawings, in which:

FIGS. 5A and 5B are plan views illustrating other examples of first and second connection electrodes in the multilayer capacitor of FIG. 1, respectively;

FIG. 6 is an exploded perspective view illustrating other examples of a groove part and a connection electrode in the multilayer capacitor of FIG. 1;

FIGS. 7A and 7B are plan views illustrating other examples of the first and second internal electrodes in the multilayer capacitor of FIG. 1, respectively;

FIG. 8 is a cross-sectional illustrating an end surface of a body to which the internal electrodes of FIG. 7 are applied;

FIGS. 9A and 9B are plan views illustrating other examples of the first and second internal electrodes in the multilayer capacitor of FIG. 1, respectively;

FIG. 10 is a cross-sectional illustrating an end surface of a body to which the internal electrodes of FIG. 9 are applied;

DETAILED DESCRIPTION

Hereinafter, exemplary embodiments of the present disclosure will be described in detail with reference to the accompanying drawings.

Directions of a body will be defined in order to clearly describe exemplary embodiments in the present disclosure. X, Y, and Z illustrated in the accompanying drawings refer to a length direction, a width direction, and a thickness direction, respectively. Here, the thickness direction may be the same as a stacking direction in which dielectric layers and internal electrodes are stacked.

Further, in the present exemplary embodiment, for convenience of explanation, both surfaces of a body 110 opposing each other in the Z direction will be defined as first and second surfaces S1 and S2, both surfaces of the body 110 opposing each other in the X direction and connecting ends of the first and second surfaces S1 and S2 to each other will be defined as third and fourth surfaces S3 and S4, and both surfaces of the body 110 opposing each other in the Y direction and connecting ends of the first and second surfaces S1 and S2 to each other and connecting ends of the third and fourth surfaces S3 and S4 to each other, respectively, will be defined as fifth and sixth surfaces S5 and S6. Here, the first surface S1 may be the same as a mounting surface.

Multilayer Capacitor

Figure 1:
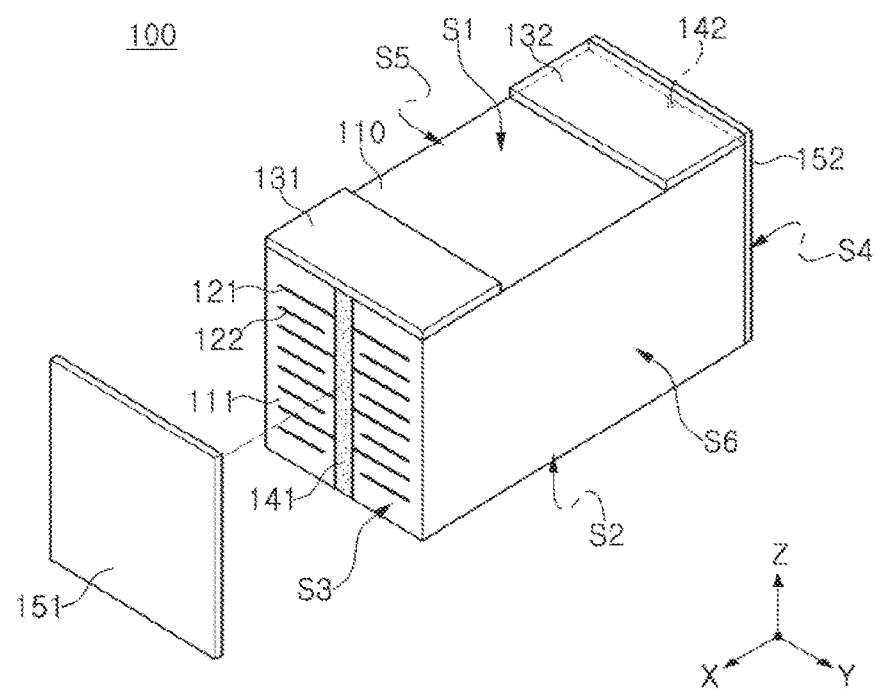
FIG. 1 is an exploded perspective view schematically illustrating a multilayer capacitor according to an exemplary embodiment in the present disclosure in an inverted state.
Figures 2A, 2B:
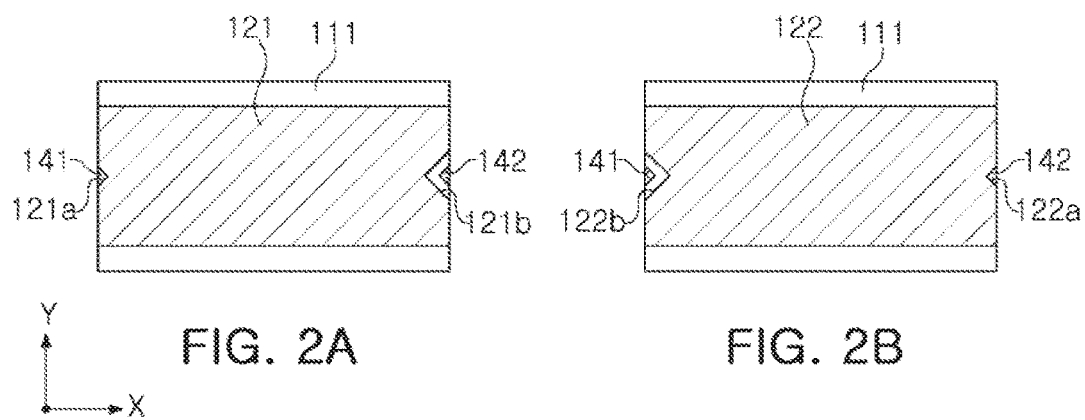
FIGS. 2A and 2B are plan views illustrating first and second internal electrodes in the multilayer capacitor of FIG. 1, respectively.
Figure 3:
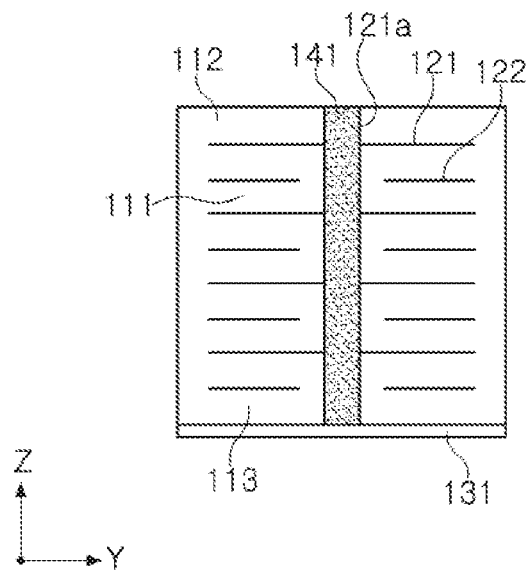
FIG. 3 is a cross-sectional of a body of FIG. 1.

FIG. 1 is an exploded perspective view schematically illustrating a multilayer capacitor according to an exemplary embodiment in the present disclosure in an inverted state, FIGS. 2A and 2B are plan views illustrating first and second internal electrodes in the multilayer capacitor of FIG. 1, respectively, and FIG. 3 is a cross-sectional of a body of FIG. 1.

Referring to FIGS. 1 through 3, a multilayer capacitor 100 according to an exemplary embodiment in the present disclosure may include a body 110 including dielectric layers 111, first and second internal electrodes 121 and 122, and first and second groove parts 121a and 122a, and first and second connection electrodes 141 and 142.

The body 110 may be formed by stacking a plurality of dielectric layers 111, and have an approximately hexahedral shape as illustrated, but a shape of the body 110 is not limited thereto.

Here, the shape and a dimension of the body 110 and the number of stacked dielectric layers 111 are not limited to those illustrated in the accompanying drawings.

In addition, the dielectric layers 111 may be in a sintered state, and adjacent dielectric layers 111 may be integrated with each other so that boundaries therebetween may not be readily apparent without the use of a scanning electron microscope (SEM).

The body 110 as described above may include an active region including the first and second internal electrodes 121 and 122 as a part contributing to the formation of capacitance of the capacitor and upper and lower cover regions 112 and 113 disposed on and below the active regions as margin parts.

The active region may be formed by repeatedly stacking a plurality of first and second internal electrodes 121 and 122 with respective dielectric layers 111 interposed therebetween.

Here, a thickness of the dielectric layer 111 may be arbitrarily changed depending on a capacitance design of the multilayer capacitor 100.

In addition, the dielectric layer 111 may contain ceramic powder particles having permittivity, for example, barium titanate ($BaTiO_3$) based powder particles or strontium titanate ($SrTiO_3$) based powder particles. However, a material of the dielectric layer 111 is not limited thereto.

Further, the dielectric layer 111 may further contain at least one of ceramic additives, organic solvents, plasticizers, binders, dispersants, and the like, if necessary, in addition to the ceramic powder particles.

The upper and lower cover regions 112 and 113 may be positioned in upper and lower portions of the body 110 in the Z direction, respectively, be formed of the same material as that of the dielectric layer 111, and have the same configuration as that of the dielectric layer 111, except that they do not include the internal electrodes.

The upper and lower cover regions 112 and 113 as described above may be prepared by stacking a single or two or more dielectric layers 111 on upper and lower portions of the active region in the Z direction, respectively, and may basically serve to prevent the first and second internal electrodes 121 and 122 from being damaged by physical or chemical stress.

The first and second internal electrodes 121 and 122 may be electrodes having different polarities from each other.

The first and second internal electrodes 121 and 122 may be alternately disposed in the body 110 in the Z direction with respective dielectric layers 111 interposed therebetween, be formed by printing a conductive paste containing a conductive metal on the dielectric layer 111 at a predetermined thickness, and be electrically insulated from each other by respective dielectric layers 111 interposed therebetween.

The conductive metal contained in the conductive paste may be, for example, nickel (Ni), copper (Cu), palladium (Pd) or alloys thereof. However, the conductive metal contained in the conductive paste is not limited thereto.

In addition, a method of printing the conductive paste may be a screen printing method, a gravure printing method, or the like. However, the method of printing the conductive paste according to the present disclosure is not limited thereto.

The first and second internal electrodes 121 and 122 according to the present exemplary embodiment may be exposed to the third and fourth surfaces S3 and S4 of the body 110.

An overlapping area between the first and second internal electrodes 121 and 122 in the Z direction is associated with a capacitance of the capacitor.

The first and second internal electrodes 121 and 122 according to the present exemplary embodiment may be exposed to the third and fourth surfaces S3 and S4 of the body 110, such that the overlapping area between the first and second internal electrodes 121 and 122 may be significantly increased.

Particularly, in the multilayer capacitor 100 according to the exemplary embodiment in the present disclosure, the first and second groove parts 121a and 122a may include one or more corners, such that the area of overlap may be further increased as compared to a case in which the first and second groove parts 121a and 122a have a circular shape.

Therefore, capacitance of the capacitor may be increased without applying a method of thinning thicknesses of dielectric layers 111 and internal electrodes to increase the number of stacked internal electrodes according to the related art, or the like.

The first groove part 121a may be formed in the third surface S3 of the body 110 to be elongated in the Z direction.

Here, the first groove part 121a may be formed so that one end thereof is exposed to the first surface S1 of the body 110, and one end (left end in FIG. 2A) of the first internal electrode 121 in the X direction is partially removed together.

The second groove part 122a may be formed in the fourth surface S4 of the body 110 to be elongated in the Z direction.

Here, the second groove part 122a may be formed so that one end thereof is exposed to the first surface S1 of the body 110, and the other end (right end in FIG. 2B) of the second internal electrode 122 in the X direction is partially removed together.

Therefore, the first and second internal electrodes 121 and 122 may be exposed to the outside of the body 110 through the first and second groove parts 121a and 122a, respectively. That is, the first and second groove parts 121a and 122a may contact the first and second internal electrodes 121 and 122, respectively.

Figure 4:
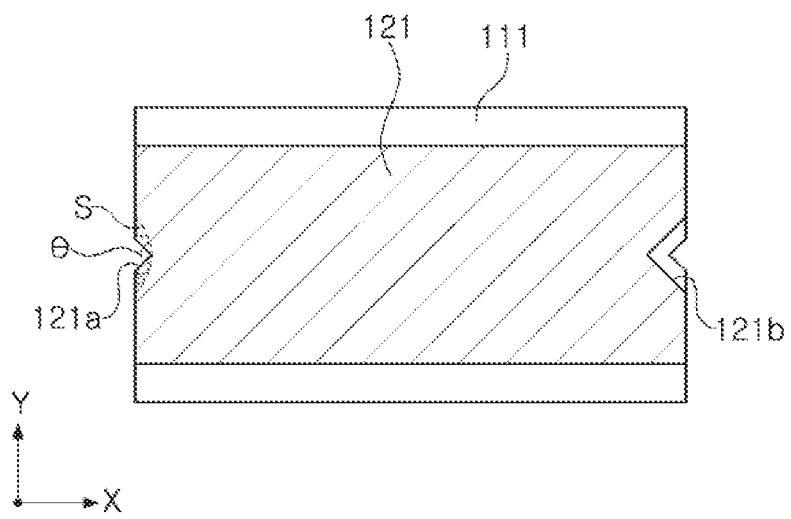
FIG. 4 illustrates a result of a comparison of areas of overlap in a case in which first and second groove parts of a multilayer capacitor according to Comparative Example have a circular shape and a case in which first and second groove parts have a triangular shape as in the multilayer capacitor according to the exemplary embodiment in the present disclosure.

FIG. 4 illustrates a comparison of areas of overlap in a case in which first and second groove parts of a multilayer capacitor according to Comparative Example have a circular shape and a case in which first and second groove parts have a triangular shape as in the multilayer capacitor according to the exemplary embodiment in the present disclosure.

An effect of increasing the area of overlap between the first and second internal electrodes 121 and 122 depending on the shape of the first and second groove parts 121a and 121b will be described with reference to FIG. 4.

According to the related art, at the time of electrically connecting internal electrodes having the same polarities to each other using a via or groove part, the via or groove part was formed to have a circular shape.

For example, in a case of processing a via or groove part using laser, the via or groove part inevitably has a circular shape. Even in a case of using a pin, since the via or groove part is formed using a circular pin due to easy processability, the via or groove part inevitably has a circular shape.

Referring to FIG. 4, in a case in which a via or groove part has a circular shape as in the related art, a shape of the via or groove part is indicated by a dotted line. In the case in which the via or groove part has the circular shape, for connection with an internal electrode, an area corresponding to a portion indicated by S is further required as compared to the first groove part 121a according to the exemplary embodiment in the present disclosure.

That is, in a case in which the groove part is formed using a circular pin having a diameter equal to a diagonal length of a tetragonal pin for forming the first and second groove parts 121a and 122a as in the exemplary embodiment in the present disclosure, an area of overlap between internal electrodes is decreased by 2×S as compared to the exemplary embodiment in the present disclosure.

Therefore, in the multilayer capacitor 100 according to the exemplary embodiment in the present disclosure, the first and second groove parts 121a and 122a may include one or more corners, such that the area of overlap may be further increased as compared to the case in which the first and second groove parts 121a and 122a have a circular shape.

For example, a planar shape of the first and second groove parts 121a and 122a of the multilayer capacitor 100 according to the exemplary embodiment in the present invention may be a triangle.

In this case, an interior angle (θ) of the corner may be 45° to 90°.

The following Table 1 illustrates results obtained by measuring a connection defect and capacitance depending on the interior angle (θ) of the corner.

TABLE 1

| Sample | Interior Angle (θ) of Corner | Connection Defect | Capacitance |
|---|---|---|---|
| 1 | 35° | X | ○ |
| 2 | 40° | X | ○ |
| 3 | 45° | ○ | ⊙ |
| 4 | 50° | ○ | ⊙ |
| 5 | 60° | ○ | ⊙ |
| 6 | 70° | ○ | ⊙ |
| 7 | 80° | ○ | ○ |
| 8 | 90° | ○ | ○ |
| 9 | 95° | ○ | X |
| 10 | 100° | ○ | X |

In Table 1, at the time of evaluating the connection defect, a case in which a connection defect occurs in one or more capacitors among 100 multilayer capacitors for test is indicated by x, and a case in which a connection defect does not occur is indicated by ○.

Further, at the time of evaluating capacitance in Table 1, based on a case in which a groove part has a circular shape, a case in which capacitance is increased by 2% or more is indicated by ⊙, a case in which capacitance is equal or decreased is indicated by x, and other cases are indicated by ○.

Referring to Table 1, in a case in which the interior angle (θ) of the corner is less than 45°, connectivity between the first and second connection electrodes 141 and 142 and the first and second internal electrodes 121 and 122 may be decreased, such that the connection defect may occur. On the contrary, in a case in which the interior angle (θ) of the corner is more than 90°, the area of overlap between the first and second internal electrodes 121 and 122 may be equal to or smaller than that in a case in which the groove parts have a circular shape.

Therefore, since in the first and second groove parts 121a and 122a of the multilayer capacitor 100 according to the exemplary embodiment in the present disclosure, the interior angle (θ) is in a range of 45° to 90°, connectivity between the internal electrodes and the connection electrodes may be improved, and at the same time, capacitance of the multilayer capacitor may be improved.

Referring to FIG. 1, the first connection electrode 141 may be formed by filling the first groove part 121a with a conductive material.

The first connection electrode 141 may contact the end of the first internal electrode 121 corresponding to the first groove part 121a to electrically connect the plurality of first internal electrodes 121 stacked in the Z direction to each other.

Here, one end of the first connection electrode 141 in the Z direction may be exposed to the first surface S1 of the body 110.

Referring to FIG. 1, the second connection electrode 142 may be formed by filling the second groove part 122a with a conductive material.

The second connection electrode 142 may contact the end of the second internal electrode 122 corresponding to the second groove part 122a to electrically connect the plurality of second internal electrodes 122 stacked in the Z direction to each other.

Here, one end of the second connection electrode 142 in the Z direction may be exposed to the first surface S1 of the body 110.

The first and second connection electrodes 141 and 142 as described above may be formed of a conductive paste containing a conductive metal.

In addition, the conductive metal may be, for example, nickel (Ni), copper (Cu), palladium (Pd), gold (Au), or alloys thereof, but is not limited thereto.

Alternatively, first and second connection electrodes 141' and 142' may have an indented shape as in FIGS. 5A and 5B.

That is, a conductive material may be disposed in a film form on surfaces of the first and second groove parts 121a and 122a.

A first non-electrode region 121b may be formed in an end of the first internal electrode 121 contacting the fourth surface S4 of the body 110.

The first non-electrode region 121b may be formed to be larger than the second groove part 122a at a position corresponding to the second groove part 122a.

A second non-electrode region 122b may be formed in an end of the second internal electrode 122 contacting the third surface S3 of the body 110.

The second non-electrode region 122b may be formed to be larger than the first groove part 121a in a position corresponding to the first groove part 121a.

Therefore, since the first connection electrode 141 contacts the first internal electrodes 121 by the first groove part 121a, but is spaced apart from the second internal electrodes 122 by the second non-electrode region 122b, the first connection electrode 141 may only be electrically connected to the plurality of first internal electrodes 121 and may not be electrically connected to the second internal electrodes 122.

The first non-electrode region 121b may extend from the second connection electrode 142 by 30 μm or more in order to secure insulation properties. Further, the second non-electrode region 122b may extend from the first connection electrode 141 by 30 μm or more in order to secure insulation properties.

In a case in which a distance between an electrode region and a connection electrode that needs to be spaced apart from the connection electrode is less than 30 μm, insulating properties may be decreased, such that a short-circuit may occur.

Therefore, occurrence of the short-circuit may be prevented by forming the non-electrode region, and the connection electrode that needs to be spaced apart from the electrode region, to be spaced apart from each other by a distance of 30 μm or more.

Since the second connection electrode 142 contacts the second internal electrodes 122 by the second groove part 122a, but is spaced apart from the first internal electrodes 121 by the first non-electrode region 121b, the second connection electrode 142 may be electrically connected to only the plurality of second internal electrodes 122 and may not be electrically connected to the first internal electrodes 121.

In addition, first and second external electrodes 131 and 132 may be disposed on the first surface S1 of the body 110 to be spaced apart from each other in the X direction.

The first external electrode 131 may contact a portion of the first connection electrode 141 exposed to the first surface S1 of the body 110 to thereby be electrically connected thereto.

The second external electrode 132 may contact a portion of the second connection electrode 142 exposed to the first surface S1 of the body 110 to thereby be electrically connected thereto.

According to the present exemplary embodiment, since the first and second external electrodes 131 and 132 are formed on the first surface S1 of the body 110 in a substantially flat shape, the first and second external electrodes 131 and 132 may have a uniform thickness, and a size distribution of the multilayer capacitor may be decreased.

The first and second external electrodes 131 and 132 as described above may be formed by plating a conductive metal.

Further, first and second insulating layers 151 and 152 may be formed on the third and fourth surfaces S3 and S4 of the body 110.

The first and second insulating layers 151 and 152 may be formed by molding the third and fourth surfaces S3 and S4 of the body 110 with a non-conductive material, or attaching the desired number of separate ceramic sheets, or the like, on the third and fourth surfaces S3 and S4 of the body 310, but a method of forming the first and second insulating layers 151 and 152 is not limited thereto.

Here, the first and second insulating layers 151 and 152 may be formed of at least one of an insulating resin, an insulating ceramic, an insulating resin and a filler, but a material of the first and second insulating layers 151 and 152 is not limited thereto.

The first and second insulating layers 151 and 152 as described above may serve to cover portions of the first and second internal electrodes 121 and 122 exposed to the third and fourth surfaces S3 and S4 of the body 110 and portions of the first and second connection electrodes 141 and 142 exposed to the third and fourth surfaces S3 and S4 of the body 110.

Further, the first and second insulating layers 151 and 152 may improve durability of the body 110 and further secure a margin having a predetermined thickness, thereby serving to improve reliability of the capacitor.

Meanwhile, since the first and second insulating layers 151 and 152 are formed after forming the body 110, in a case of significantly decreasing thicknesses of the first and second insulating layers 151 and 152 as long as the insulation properties, durability of the body 110, and reliability of the capacitor are maintained at a predetermined level, a size of a product may be significantly decreased.

In the multilayer capacitor 100 configured as described above, volumes of external terminals and an entire height of the capacitor may be significantly decreased, and thus, relatively, a volume and a height for increasing sizes of the internal electrodes may be further secured, such that capacitance of the capacitor may be further improved in accordance therewith.

Further, since a thickness of the capacitor is significantly decreased, a thin film multilayer capacitor having a thickness of 100 μm or less may be manufactured.

FIG. 6 is an exploded perspective view illustrating other examples of a groove part and a connection electrode in the multilayer capacitor of FIG. 1.

Here, since structures of dielectric layers 111, first and second external electrodes 131 and 132, and first and second insulating layers 151 and 152 are similar to those in the exemplary embodiment described above, detailed descriptions thereof will be omitted in order to avoid overlapped descriptions.

Referring to FIG. 6, a body 110' of a multilayer capacitor 100' may include a plurality of first and second groove parts 121a' and 122a' and a plurality of first and second connection electrodes 141 and 142.

A pair of first groove parts 121a' may be formed on a third surface S3 of the body 110' to be spaced apart from each other in a Y direction of the body 110', and the first connection electrode 141 may be filled in each of the first groove parts 121a'.

A pair of second groove parts 122a' may be formed on a fourth surface S4 of the body 110' to be spaced apart from each other in the Y direction of the body 110', and the second connection electrode 142 may be filled in each of the second groove parts 122a'.

Meanwhile, although a case in which the number of each of the first and second groove parts is two is illustrated in FIG. 6, the number of first and second groove parts may be three or more.

FIGS. 7A and 7B are plan views illustrating other examples of the first and second internal electrodes in the multilayer capacitor of FIG. 1, respectively, and FIG. 8 is a cross-sectional illustrating an end surface of the body to which the internal electrodes of FIG. 7 are applied.

Here, since structures of dielectric layers 111, first and second connection electrodes 141 and 142, first and second external electrodes 131 and 132, and first and second insulating layers 151 and 152 are similar to those in the exemplary embodiment described above, detailed descriptions thereof will be omitted in order to avoid overlapped descriptions.

Referring to FIGS. 7 and 8, a first internal electrode 123 may be exposed to the third surface S3 of the body 110 and spaced apart from the fourth surface S4 of the body 110, and a second internal electrode 124 may be exposed to the fourth surface S4 of the body 110 and spaced apart from the third surface S3 of the body 110.

A first groove part 123a may be formed so that one end (a left end in FIG. 7A) of the first internal electrode 123 in the X direction is partially removed, and a second groove part 124a may be formed so that the other end (a right end in FIG. 7B) of the second internal electrode 124 in the X direction is partially removed.

Here, a spaced distance between an end of the first internal electrode 123 and the fourth surface S4 of the body 110 needs to be sufficiently long to prevent the first internal electrode 123 from overlapping the second groove part 124a, and a spaced distance between an end of the second internal electrode 124 and the third surface S3 of the body 110 needs to be sufficiently long to prevent the second internal electrode 124 from overlapping the first groove part 123a.

In addition, first and second connection electrodes 141 and 142 may be formed in the first and second groove parts 123a and 124a.

Therefore, the first connection electrode 141 may contact the first internal electrode 123 by the first groove part 123a but may not be electrically connected to the second internal electrode 124 in a state in which the first connection electrode 141 is spaced apart from the second internal electrode 124.

The second connection electrode 142 may contact the second internal electrode 124 by the second groove part 124a but may not be electrically connected to the first internal electrode 123 in a state in which the second connection electrode 142 is spaced apart from the first internal electrode 123.

FIGS. 9A and 9B are plan views illustrating other examples of the first and second internal electrodes in the multilayer capacitor of FIG. 1, respectively, and FIG. 10 is a cross-sectional illustrating an end surface of the body to which the internal electrodes of FIGS. 9A and 9B are applied.

Here, since structures of dielectric layers 111, first and second connection electrodes 141 and 142, first and second external electrodes 131 and 132, and first and second insulating layers 151 and 152 are similar to those in the exemplary embodiment described above, detailed descriptions thereof will be omitted in order to avoid overlapped descriptions.

Referring to FIGS. 9A, 9B and 10, first and second internal electrodes 125 and 126 may be spaced apart from both of the third and fourth surfaces S3 and S4 of the body 110.

A spaced distance m3 between an end of the first internal electrode 125 and the fourth surface S4 of the body 110 facing each other in the X direction may be larger than a spaced distance m1 between an end of the first internal electrode 125 and the third surface S3 of the body 110 facing each other in the X direction.

A spaced distance m4 between an end of the second internal electrode 126 and the third surface S3 of the body 110 facing each other in the X direction may be larger than a spaced distance m2 between an end of the second internal electrode 126 and the fourth surface S4 of the body 110 facing each other in the X direction.

A first groove part 125a may be formed so that one end (left end in FIG. 9A) of the first internal electrode 125 in the X direction is partially removed together, and a second groove part 126a may be formed so that the other end (right end in FIG. 9B) of the second internal electrode 126 in the X direction is partially removed together.

Here, the spaced distance m3 between the end of the first internal electrode 125 and the fourth surface S4 of the body 110 needs to be long enough to prevent the first internal electrode 126 from overlapping the second groove part 126a, and the spaced distance m4 between the end of the second internal electrode 126 and the third surface S3 of the body 110 needs to be long enough to prevent the second internal electrode 124 from overlapping the first groove part 125a.

In addition, first and second connection electrodes 141 and 142 may be formed in the first and second groove parts 125a and 126a.

Therefore, the first connection electrode 141 may contact the first internal electrode 125 by the first groove part 125a but may not be electrically connected to the second internal electrode 126 in a state in which the first connection electrode 141 is spaced apart from the second internal electrode 126.

The second connection electrode 142 may contact the second internal electrode 126 by the second groove part 126a but may not be electrically connected to the first internal electrode 125 in a state in which the second connection electrode 142 is spaced apart from the first internal electrode 125.

According to the present exemplary embodiment, the internal electrodes may be disposed at positions spaced inwardly of the body, such that an effect of preventing cracks and delamination mainly occurring in ends of the body may be improved.

Figure 11:
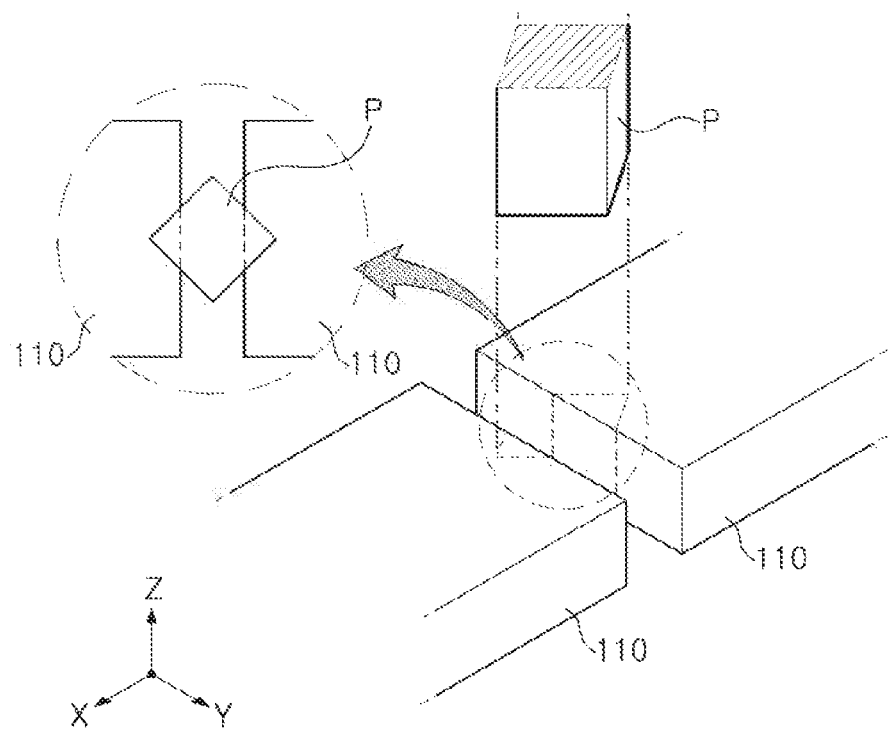
FIGS. 11 and 12 are perspective views illustrating some processes used in manufacturing the multilayer capacitor of FIG. 1.
Figure 12:
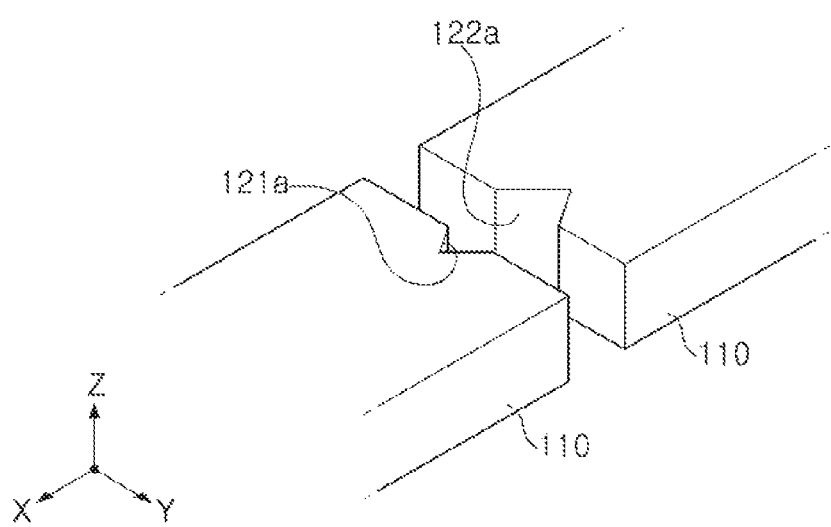

FIGS. 11 and 12 are perspective views illustrating some processes used in manufacturing the multilayer capacitor of FIG. 1.

Hereinafter, a method of manufacturing the multilayer capacitor according to the present exemplary embodiment will be described with reference to FIGS. 11 and 12.

First, a plurality of first and second ceramic sheets may be prepared.

Next, first and second internal electrodes may be formed by printing a conductive paste on one surfaces of the first and second ceramic sheets at a predetermined thickness, respectively.

Then, the plurality of first and second ceramic sheets on which the first and second internal electrodes are formed, respectively, may be alternately stacked and pressed in a Z direction, such that a bar shaped laminate may be prepared.

Then, punching may be performed on the laminate at a predetermined interval using a tetragonal pin. Referring to FIG. 11, a position at which the punching is performed in the laminate is a point corresponding to an end portion of the body 110 in the X direction after cutting.

Therefore, as illustrated in FIG. 12, first and second groove parts 121*a* and 122*a* may be formed in end portions of adjacent bodies 110, respectively.

Next, connection electrodes may be formed by filling a conductive material or covering a surface in the first and second groove parts 121*a* and 122*a*. Thereafter, external electrodes may be formed on a mounting surface to be electrically connected to the connection electrodes, thereby completing the multilayer capacitor.

Board Having Multilayer Capacitor

Figure 13:
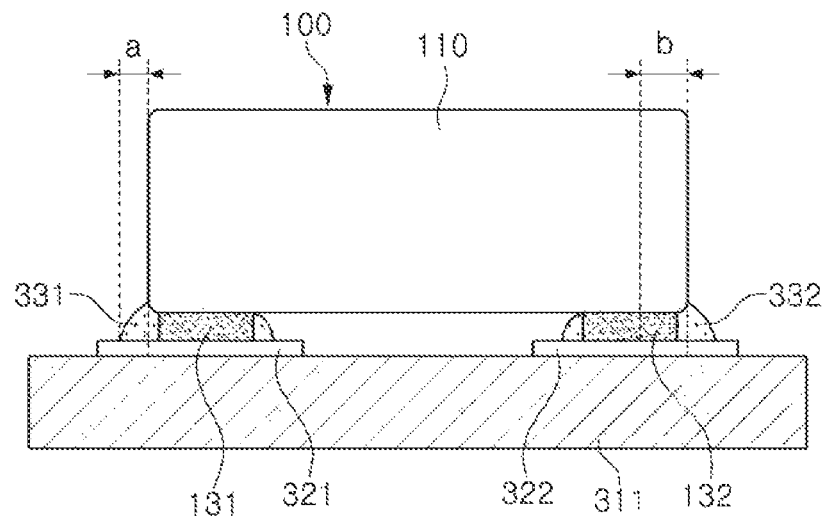
FIG. 13 is a cross-sectional view illustrating a state in which the multilayer capacitor of FIG. 1 is mounted on a circuit board.
Figure 14:
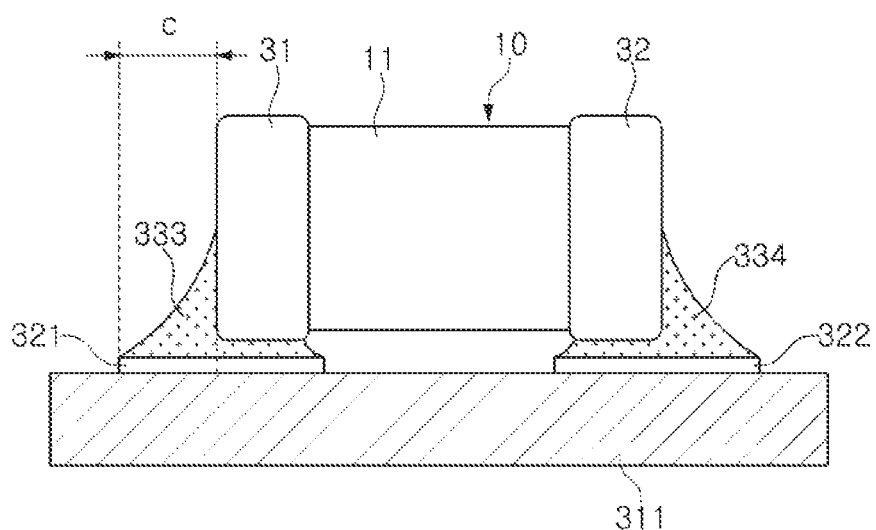
FIG. 14 is a cross-sectional view illustrating a state in which a 2-terminal capacitor according to the related art is mounted on a circuit board.

FIG. 13 is a cross-sectional view illustrating a state in which the multilayer capacitor of FIG. 1 is mounted on a circuit board; and FIG. 14 is a cross-sectional view illustrating a state in which a 2-terminal capacitor according to the related art is mounted on a circuit board.

Referring to FIG. 13, a board having a multilayer capacitor according to the present exemplary embodiment may include a circuit board 311 on which the multilayer capacitor 100 is mounted, and first and second electrode pads 321 and 322 disposed on an upper surface of the circuit board 311 to be spaced apart from each other.

The multilayer capacitor 100 may be fixed and electrically connected to the circuit board 311 by solders 331 and 332 in a state in which the first and second external electrodes 131 and 132 are positioned to contact the first and second electrode pads 321 and 322, respectively.

Since in the board having a multilayer capacitor as described above, the first and second external electrodes 131 and 132 of the multilayer capacitor 100 are only exposed to the mounting surface of the body 110, a formation area a of the solders 331 and 332 on the circuit board 311 may be significantly decreased.

In a case in which the formation area a of the solders 331 and 332 is decreased as described above, acoustic noise may be decreased, and when the mounting area is the same as that of a capacitor according to the related art, a chip size may be increased by further securing a size corresponding to b as compared to the capacitor according to the related art, capacitance of the capacitor may be relatively increased.

Referring to FIG. 14, in a 2-terminal multilayer capacitor 10 according to the related art, first and second external electrodes 31 and 33 enclose both end portions of a body 11, such that a formation area c of solders 333 and 334 at the time of mounting the 2-terminal multilayer capacitor 10 on a circuit board 311 may be relatively increased as compared to the capacitor of FIG. 13.

When the formation area c of the solders 333 and 334 is increased as described above, acoustic noise may be increased, and when a mounting area is the same as that of the capacitor of FIG. 13, the formation area of the solders may be further required as compared to the capacitor of FIG. 13, and thus a chip size may be decreased, such that capacitance of the capacitor may be relatively decreased.

Meanwhile, although the board in which the multilayer capacitor of FIG. 1 is mounted on the circuit board is illustrated in FIG. 13, the board is not limited thereto. That is, various multilayer capacitors described above may also be mounted on the circuit board in a similar structure, thereby configuring a board having a multilayer capacitor.

As set forth above, according to exemplary embodiments in the present disclosure, since the first and second internal electrodes are electrically connected to each other through the first and second connection electrodes formed along the stacking direction of the dielectric layers, respectively, the area of overlap between the internal electrodes having different polarities may be increased, such that capacitance of the product may be increased at the same size without increasing the number of stacked dielectric layers while thinning the thicknesses of the dielectric layers and the internal electrodes, or increasing permittivity.

Further, since the external terminals are disposed only on the mounting surface of the body, at the time of mounting the multilayer capacitor on the circuit board, a contact area with the solders may be decreased, such that the mounting area may be decreased.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a body including dielectric layers, and first and second internal electrodes alternately disposed with respective dielectric layers interposed therebetween;
first and second groove parts formed in external surfaces of the body in a first direction in which the dielectric layers are stacked, having at least one corner, and contacting the first and second internal electrodes, respectively; and
first and second connection electrodes disposed in the first and second groove parts, respectively, and electrically connected to the first and second internal electrodes, respectively,
wherein a cross-sectional shape of the first and second groove parts when viewed in the first direction is triangular.

2. The multilayer capacitor of claim 1,
wherein an interior angle of the corner is in a range of 45° to 90°.

3. A multilayer capacitor comprising:
a body including dielectric layers, and first and second internal electrodes alternately disposed with respective dielectric layers interposed therebetween;
first and second groove parts formed in external surfaces of the body in a first direction in which the dielectric layers are stacked, having at least one corner, and contacting the first and second internal electrodes, respectively; and
first and second connection electrodes disposed in the first and second groove parts, respectively, and electrically connected to the first and second internal electrodes, respectively,
wherein an interior angle of the corner is in a range of 45° to 70°.

4. The multilayer capacitor of claim 1, wherein the first and second insulating layers cover exposed portions of the first and second connection electrodes, respectively.

5. The multilayer capacitor of claim 1, wherein the first and second internal electrodes are exposed to both surfaces of the body in a second direction, perpendicular to the first direction, respectively, the first groove part is formed in one surface of the body in the second direction such that a portion of an end of the first internal electrode is removed; and the second groove part is formed in the other surface of the body in the second direction such that a portion of an end of the second internal electrode is removed.

6. A multilayer capacitor comprising:

a body including dielectric layers, and first and second internal electrodes alternately disposed with respective dielectric layers interposed therebetween;

first and second groove parts formed in external surfaces of the body in a first direction in which the dielectric layers are stacked, having at least one corner, and contacting the first and second internal electrodes, respectively; and first and second connection electrodes disposed in the first and second groove parts, respectively, and electrically connected to the first and second internal electrodes, respectively, wherein the first internal electrode includes a first non-electrode region in contact with the second groove part, and the second internal electrode includes a second non-electrode region in contact with to the first groove part.

7. The multilayer capacitor of claim 6, wherein the first non-electrode region extends from the second groove part by 30 μm or more, and the second non-electrode region extends from the first groove part by 30 μm or more.

8. The multilayer capacitor of claim 1, wherein the first internal electrode is exposed to one surface of the body in a second direction, perpendicular to the first direction and spaced apart from the other surface of the body in the second direction so as to be spaced apart from the second connection electrode, the second internal electrode is exposed to the other surface of the body in the second direction and spaced apart from the one surface of the body in the second direction so as to be spaced apart from the first connection electrode, the first groove part is disposed in the one surface of the body in the second direction such that a portion of an end of the first internal electrode is removed, and the second groove part is disposed in the other surface of the body in the second direction such that a portion of an end of the second internal electrode is removed.

9. A multilayer capacitor comprising:

a body including dielectric layers, and first and second internal electrodes alternately disposed with respective dielectric layers interposed therebetween;

first and second groove parts formed in external surfaces of the body in a first direction in which the dielectric layers are stacked, having at least one corner, and contacting the first and second internal electrodes, respectively, the first and second groove parts having a triangular cross-section when viewed in the first direction; and first and second connection electrodes disposed in the first and second groove parts, respectively, and electrically connected to the first and second internal electrodes, respectively, wherein the first and second internal electrodes are spaced apart from both surfaces of the body in a second direction, perpendicular to the first direction, the first groove part is disposed in one surface of the body in the second direction such that a portion of one end of the first internal electrode is removed, and the second groove part is disposed in the other surface of the body in the second direction such that a portion of one end of the second internal electrode is removed, the other end of the first internal electrode in the second direction being further spaced apart from an end of the body than the one end of the first internal electrode in the second direction so as to be spaced apart from the second connection electrode, and the other end of the second internal electrode in the second direction being further spaced apart from the end of the body than the one end of the second internal electrode in the second direction so as to be spaced apart from the first connection electrode.

10. A multilayer capacitor comprising:

a body including dielectric layers, and first and second internal electrodes alternately disposed with respective dielectric layers interposed therebetween;

first and second groove parts formed in external surfaces of the body in a first direction in which the dielectric layers are stacked, having at least one corner, and contacting the first and second internal electrodes, respectively, the first and second groove parts having a triangular cross-section when viewed in the first direction; and first and second connection electrodes disposed in the first and second groove parts, respectively, and electrically connected to the first and second internal electrodes, respectively, wherein the number of each of the first and second groove parts is two or more, and the number of each of the first and second connection electrodes is two or more.

11. The multilayer capacitor of claim 1, wherein the first and second connection electrodes fill an entirety of the first and second groove parts, respectively.

12. The multilayer capacitor of claim 1, wherein the first and second connection electrodes are disposed on surfaces of the first and second groove parts, respectively.

13. A board having a multilayer capacitor, the board comprising:

a circuit board having one surface on which first and second electrode pads are disposed; and the multilayer capacitor of claim 1, mounted on the circuit board.

* * * * *